United States Patent

Knee et al.

Patent Number: 5,539,773
Date of Patent: Jul. 23, 1996

[54] METHOD AND APPARATUS FOR GHOST CANCELLING AND/OR EQUALIZING

[75] Inventors: Michael Knee, Petersfield, England; Andreas Zipp, Lünen, Germany; Andrew Hackett, Klingenthal; Nelly Bruneau, Teloché, both of France

[73] Assignee: Thomson Consumer Electronics S.A., Courbevoie, France

[21] Appl. No.: 256,930

[22] PCT Filed: Feb. 9, 1993

[86] PCT No.: PCT/EP93/00311

§ 371 Date: Dec. 19, 1994

§ 102(e) Date: Dec. 19, 1994

[87] PCT Pub. No.: WO93/16527

PCT Pub. Date: Aug. 19, 1993

[30] Foreign Application Priority Data

Feb. 17, 1992 [WO] WIPO ................ 92400532.5

[51] Int. Cl.$^6$ ................................................ H03H 7/30
[52] U.S. Cl. .................. 375/232; 375/229; 375/350; 370/32.1; 364/724.19
[58] Field of Search ........................... 375/232, 229, 375/346, 350; 370/32.1; 333/28 R, 18; 364/724.01, 724.19

[56] References Cited

U.S. PATENT DOCUMENTS

| | | | |
|---|---|---|---|
| 5,045,945 | 9/1991 | Herman et al. | 358/167 |
| 5,111,481 | 5/1992 | Chen et al. | 375/232 |
| 5,161,017 | 11/1992 | Sato | 358/166 |

FOREIGN PATENT DOCUMENTS

| | | |
|---|---|---|
| 0413460 | 7/1990 | European Pat. Off. . |
| 0421526 | 10/1990 | European Pat. Off. . |
| 0464808 | 7/1991 | European Pat. Off. . |

OTHER PUBLICATIONS

1988 IEEE Int. Symp. on CAS; 7-9 Jun. 1988 ESPOO FI; pp. 1931-1934; S. Poole: "A CMOS Subscriber Line Audio Processing Circuit Including Adaptive Balance".

IEEE Acoustics, Speech and Signal Processing Magazine, vol. 34, No. 2, Apr. 1986, New York US, pp. 309-316; R. W. Harris "A Variable Step (VS) Adaptive Filter Algorithm".

*Primary Examiner*—Stephen Chin
*Assistant Examiner*—T. Ghebretinsae
*Attorney, Agent, or Firm*—Joseph S. Tripoli; Eric P. Herrmann

[57] ABSTRACT

A method for signal equalization/ghost cancellation with an equalizing filter includes synthesizing a first equalizing filter function (LMS 1) with N (an integer) taps and associated coefficients. The respective coefficients are adjusted to minimize the error between a received reference signal output by the synthesized equalizing filter function and a non-distorted reference signal. The adjusted coefficients are evaluated to determine P (an integer) groups of M (an integer) taps and associated coefficients which contribute to said synthesized equalizing filter function according to a predetermined criterion and wherein P times M is less than N. A second equalizing filter function is synthesized corresponding to the first equalizing filter function with coefficients other than the P groups of M coefficients set to zero, and the P groups to M coefficients are adjusted to minimize the error. The adjusted P groups of M coefficients are applied to a programmable filter to configure the programmable filter to execute an equalizing filter function on received signal.

10 Claims, 10 Drawing Sheets

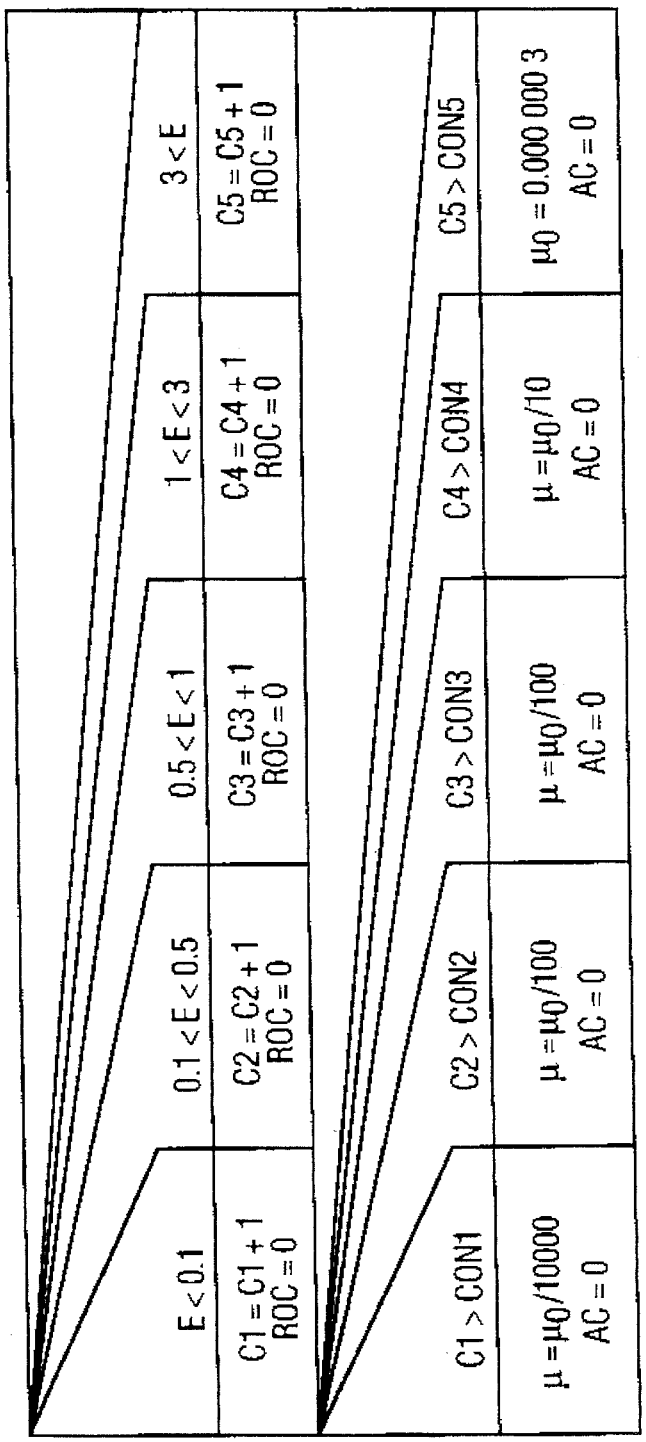
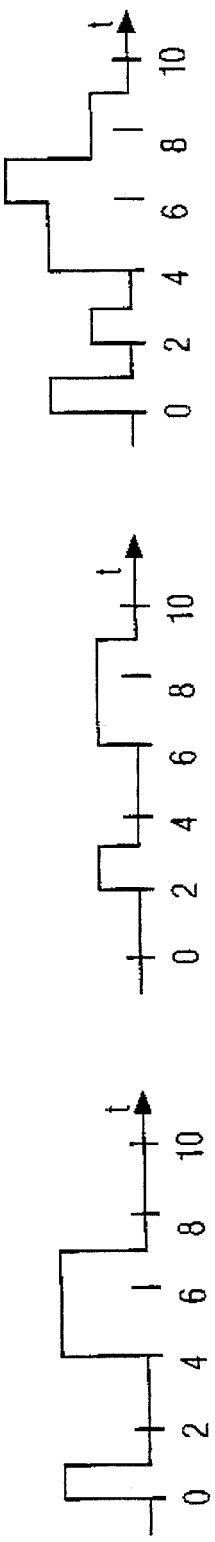
FIG. 10
FIG. 11a
FIG. 11b
FIG. 11c

METHOD AND APPARATUS FOR GHOST CANCELLING AND/OR EQUALIZING

The present invention relates to a method and to an apparatus for ghost cancelling and/or equalizing.

BACKGROUND

In "A tutorial on ghost cancelling", W. Ciciora et al, IEEE Transactions on Consumer Electronics, Vol. 25, pages 9–44, 25. February 1979, the principle of ghost cancelling is described. A received test signal is compared with an ideal version of this test signal. The coefficients of a correction filter applied to the received test signal are adjusted in such a way that the filter output signal matches as much as possible to the ideal test signal. But the filter length is limited and in a lot of cases no sufficient ghost cancellation is possible.

In "Adaptive Noise Cancelling: Principles and Applications", B. Widrow et al, Proceedings of the IEEE, pages 1692–1716, Vol. 63, No. 12, December 1975, an LMS (least-mean-square) adaptive filter for noise cancelling is introduced, wherein a new filter coefficient $w_{i(j+1)}$ is calculated according to the formula $$w_{i(j+1)} = w_{ij} + 2 * \mu * \epsilon_j * x_{ij},$$

where $w_{ij}$ is the respective existing coefficient, $\mu$ is a fixed adaptation constant, $\epsilon_j$ is the difference between the respective filter output $y_j$ and the corresponding value of the ideal reference signal and $x_{ij}$ is the respective value from the filter input signal.

INVENTION

It is one object of the invention to disclose a method for ghost cancelling and/or equalizing, where also more complex distortions and ghost signals, respectively, can be handled and where the speed and stability of adaptation is improved. This object is reached by the inventive method disclosed in claim 1.

A first long LMS adaptive filter which may have more than 1000 taps minimizes the error $\epsilon$ between the filtered output signal y of the distorted input signal x (a transmitted reference signal) and an ideal reference signal. Normally this ideal reference signal is stored within the ghost canceller/equalizer and corresponds to the reference signal which is transmitted e.g. in a specific TV line. A positioner takes coefficients from the first LMS filter and determines the most useful subset of (say 5) small filters (say 16 taps each) separated by variable delays. The position information calculated in the positioner comprises the lengths of these delays.

The subset of filters forms together with the variable delays a second LMS adaptive filter with a tap number corresponding to the first LMS filter tap number. The coefficients corresponding to the delay 'taps' can be regarded as set to zero and the locations of the delay parts of the second LMS filter remain fixed. The coefficients of the filter parts (corresponding to the small filters) are modified adaptively until the best match between the filtered received reference signal and the ideal reference signal is achieved. This process will recommence if the ghost or the received channel changes.

The first and second LMS filter need not work in real time. After establishing of the filter coefficient modification of the subsets these coefficients are copied to a real time main filter working on the whole input signal (e.g. a TV signal) with exception of said reference signal.

The main filter comprises a respective subset of adjustable small filters and a set of adjustable delays. In the following a modified equation $$w_{i(j+1)} = w_{ij} - \mu * \epsilon_j * x_{ij}$$

is used, where $\mu$ includes a factor of (−2). The 'minus' sign depends on how the error is defined.

In principle the inventive method consists in ghost cancelling and/or equalizing, wherein the coefficients of a digital filter are in principle continuously adapted to minimize the error between the filter output signal of a distorted reference signal and an ideal reference signal which is stored or which can be decoded correctly after reception, and wherein said digital filter is a first LMS filter or filter function with a high tap number and the coefficients of this filter or filter function are used by comparing stepwise values derived from such coefficients of said first LMS filter which represent the tap positions of a small filter with a reduced number of coefficients to detect depending on the level of said values the position of one or more variable delays which connect in series two or more of said small filters or filter functions and wherein said connection of small filters and delays forms a second LMS filter, of which the coefficients corresponding to said small filters are adapted and used in a main filter, wherein the positions and the delay times of said delays remain fixed during the calculation of the coefficients of said small filters and wherein the signal to be ghost cancelled and/or equalized passes said main filter at those times where said reference signal is not present.

Advantageously the adaptation constant $\mu$ for the LMS calculation in said first LMS filter and/or in said second LMS filter is adapted according to a statistic of said errors stored in memory means and updated during each LMS calculation.

In principle the inventive apparatus comprises: a main filter which works on a distorted signal with exception of a reference signal contained within said distorted signal; looped delay means which store said reference signal; a controller circuit which controls said main filter and said delay means; a central processor, which exchanges with said controller circuit control data and which reads from said delay means said reference signal and from a further input said ideal reference signal and which calculates said LMS algorithms and adjusts said variable delays within said main filter and stores said coefficients for said small filters in said main filter.

Advantageously said central processor exchanges data with a $\mu$-adaptation circuit and adapts the value for said adaptation constant $\mu$ according to a statistic of said errors stored and updated in said $\mu$-adaptation circuit.

DRAWINGS

Preferred embodiments of the invention will now be described with reference to the accompanying drawings, in which.

Figure 7:
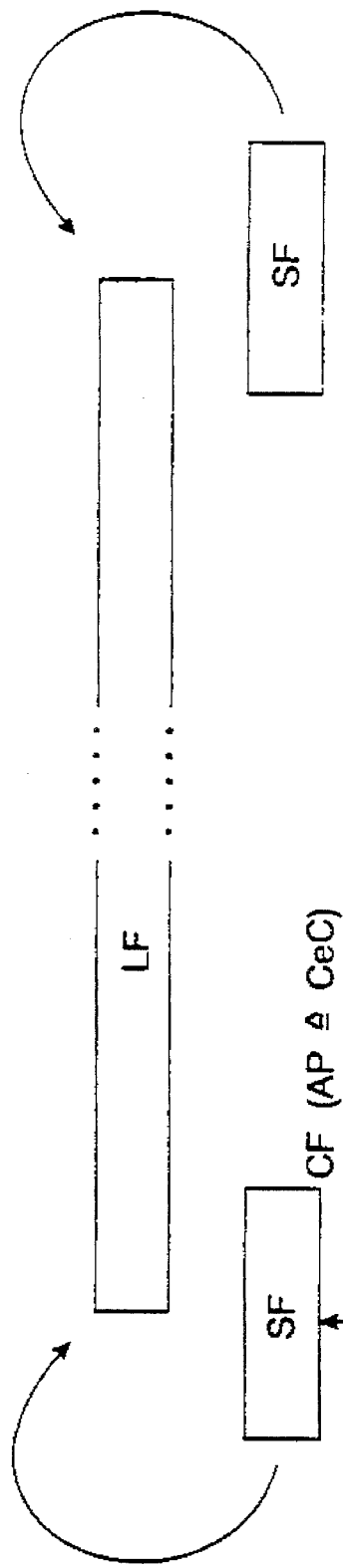
Figure 8:
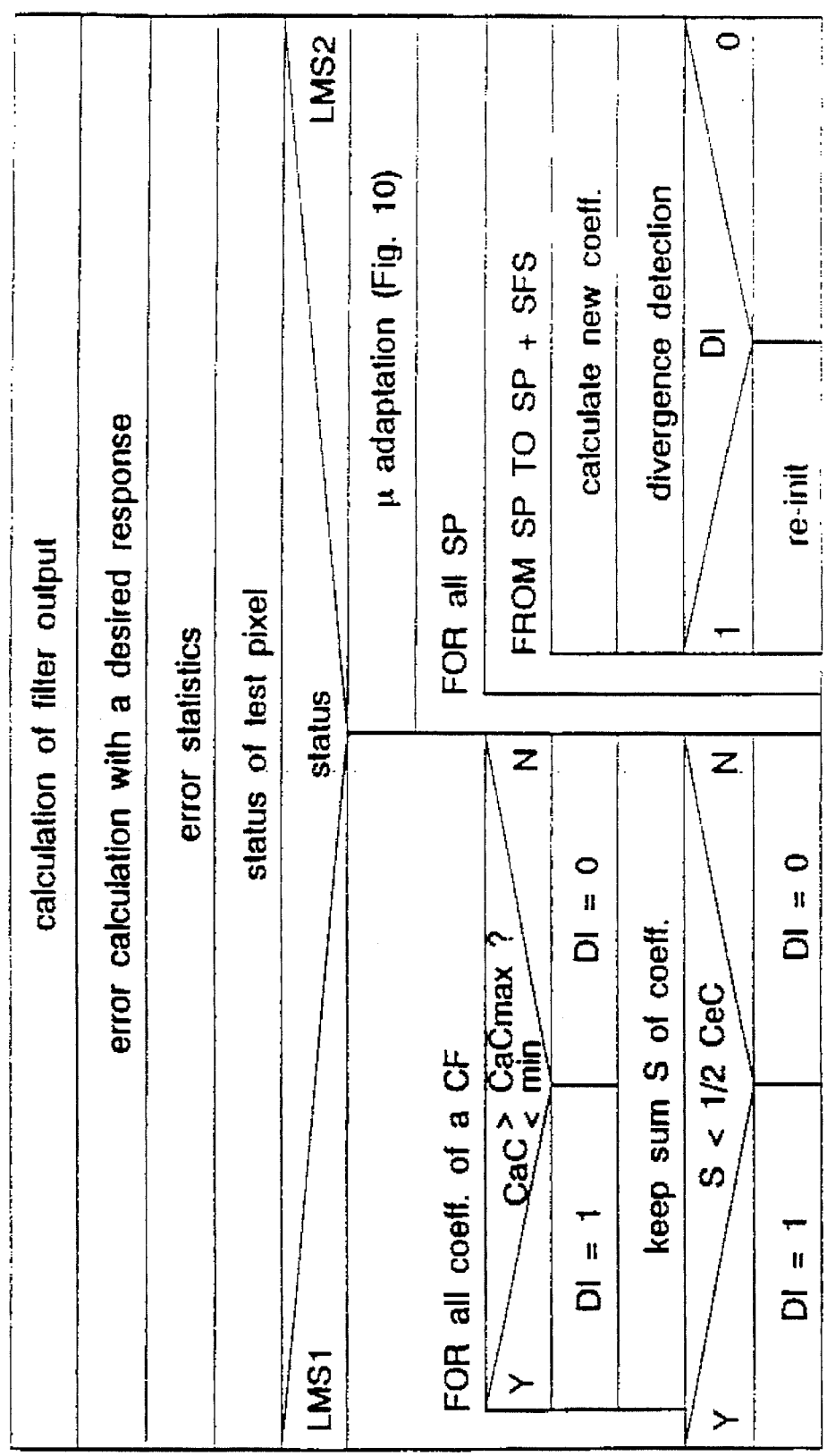
Figure 9:
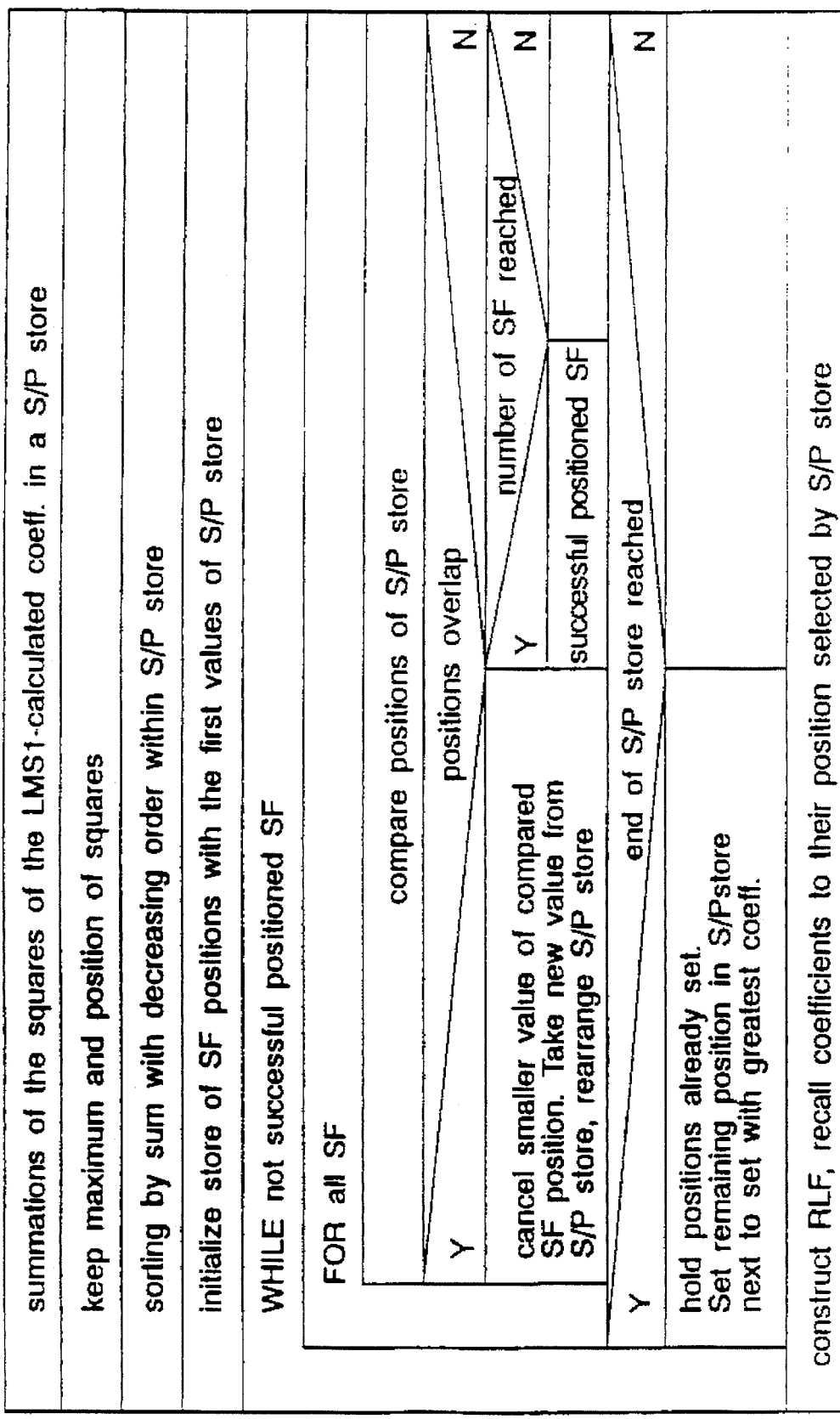
Figure 13A:
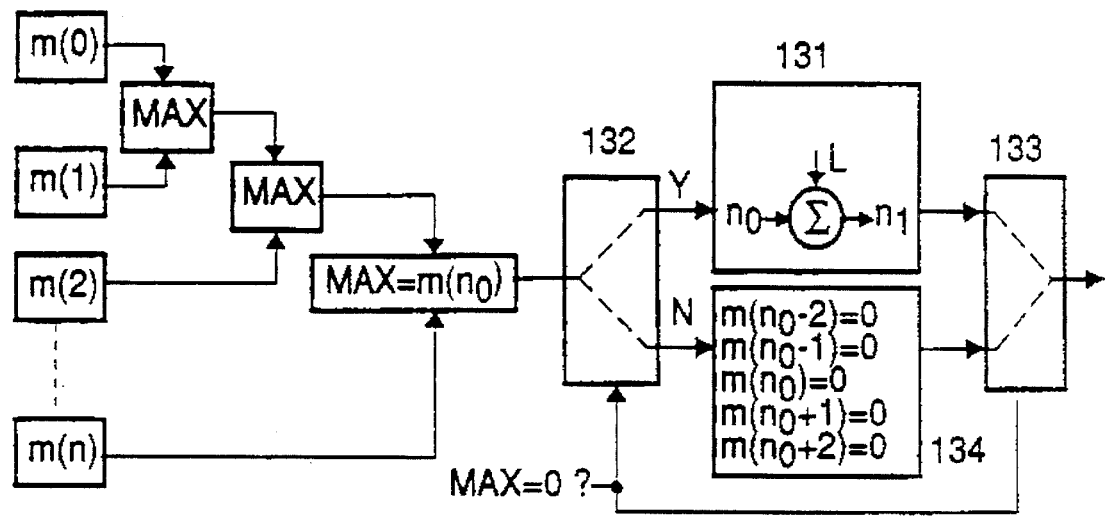
Figure 13B:
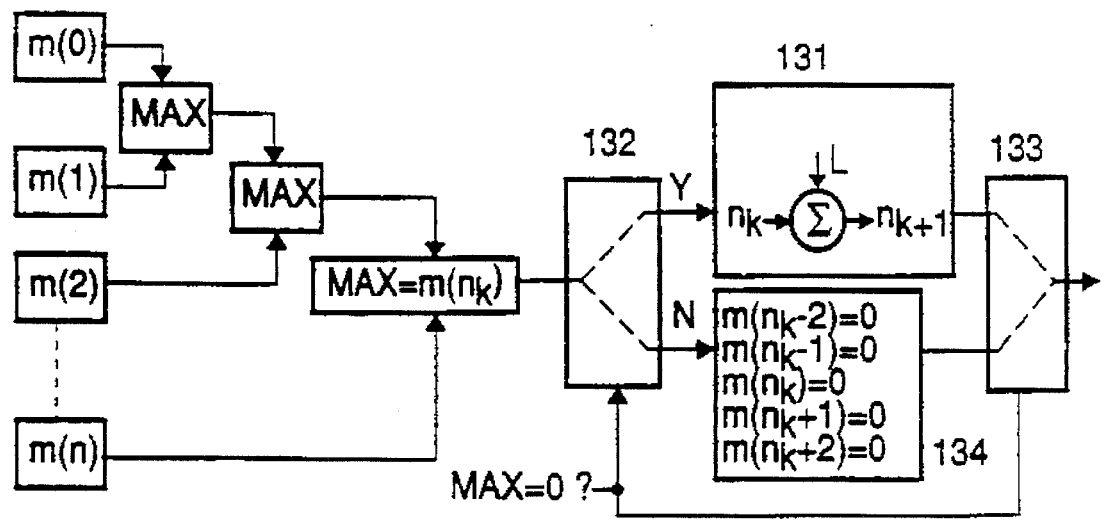
Figure 14:
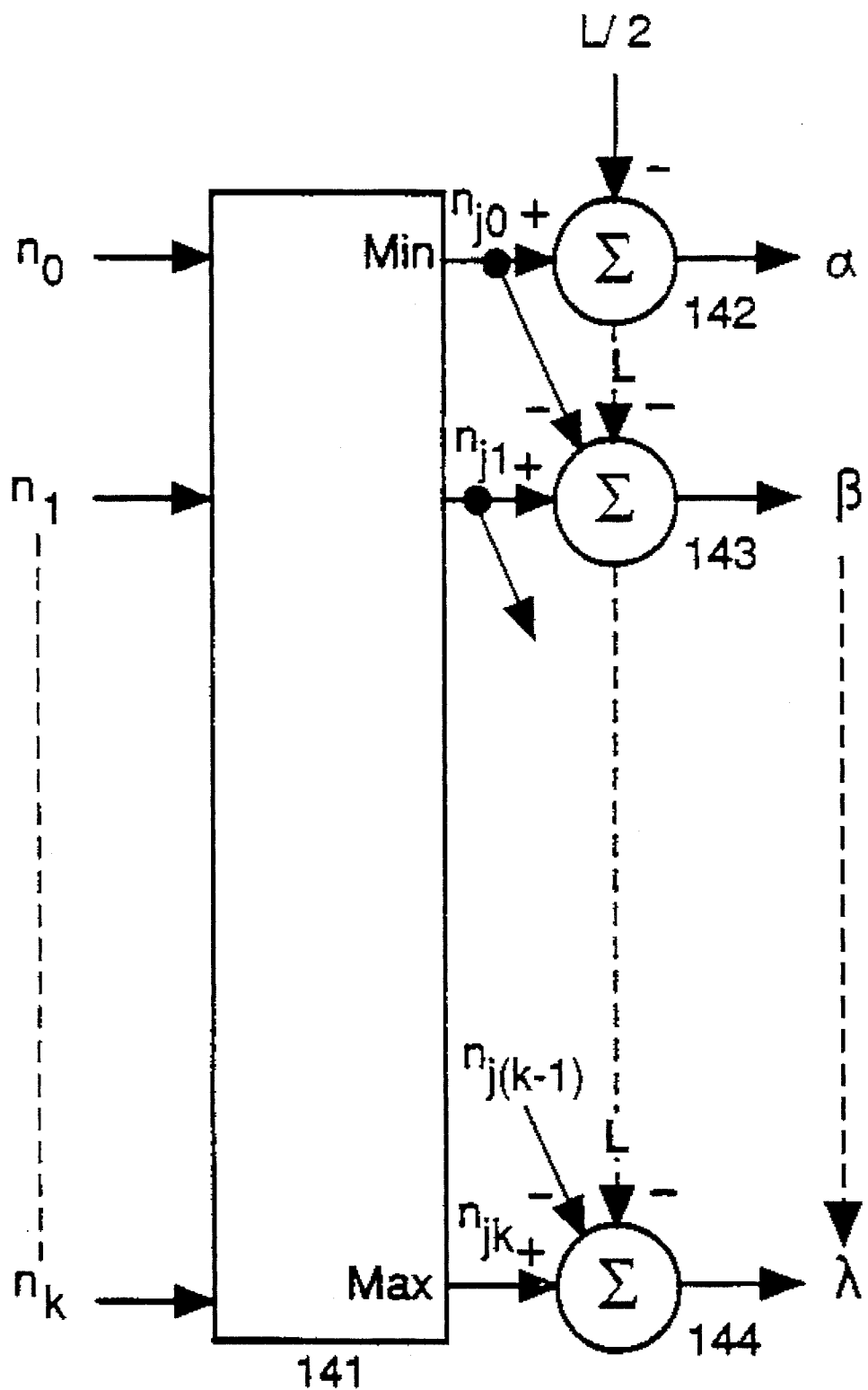

FIG. 7 explains the principle of a closed loop filter for the output signal calculation;

FIG. 8 shows a flow chart diagram for the calculation of new coefficients;

FIG. 9 shows a flow chart diagram for the positioner;

FIG. 10 shows a flow chart diagram for μ-adaptation;

FIG. 11 depicts the creation of a ghost signal;

FIGS. 12A–12B demonstrates the calculation of values m(i);

FIGS. 13A–13B shows the selection of (k+1) small filter positions;

FIG. 14 shows resorting of small filter positions and calculating of delay values.

PREFERRED EMBODIMENTS

In FIG. 11a an original signal of a TV line is depicted. A ghost signal with a delay of t=2 and an amplitude of 50% is shown in FIG. 11b. FIG. 11c shows the combined baseband signal received with a TV set.

Figure 1:
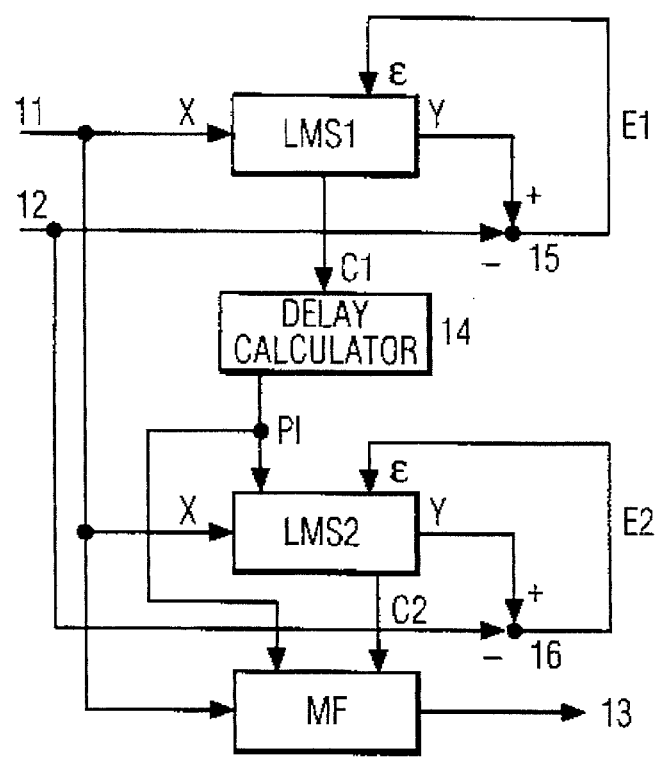
FIG. 1 shows in principle the function of the inventive apparatus.

The first adaptive LMS filter LMS1 in FIG. 1 may have 1296 taps and receives a distorted input signal x at first input 11. By suitable processing a TV line with a reference signal, e.g. line 312 of an even frame and/or line 312 of an odd frame of an HDMAC signal, is extracted from the whole TV signal and fed to input 11. A first subtractor 15 calculates the error E1 ($\epsilon$) between the filtered output signal y of the distorted input signal x (a transmitted reference signal) and an ideal reference signal fed to second input 12. Normally this ideal reference signal is stored within a ghost canceller/equalizer and corresponds to the transmitted reference signal. Filter LMS1 calculates its coefficients according to the known LMS algorithm mentioned above. After a certain number of iterations the coefficients are loaded to a positioner 14. This positioner works according to the flow chart of FIG. 9 and determines the most useful subset of e.g. 5 small filters with e.g. 16 taps each, which can be thought as separated by variable delays having a maximum delay time of 1296−5*16=1216 clocks. The position information PI calculated in the positioner comprises the lengths and positions of these delays within a second adaptive LMS filter LMS2 with corresponding 1296 taps. Between each two delay parts 16 taps of a small filter are located.

The locations of the delay parts remain fixed. A second subtractor 16 calculates the error E2 ($\epsilon$) between the filtered output signal y of the distorted input signal x and the ideal reference signal fed to second input 12. The coefficients of the filter parts (corresponding to the small filters) are modified adaptively with the known LMS algorithm until the best match, i.e. a minimum value of E2, between the filtered received reference signal and the ideal reference signal is achieved. Advantageously the first and second LMS filter do not need to work in real time. After establishing of the filter coefficient modification of the subsets these coefficients are copied to a real time main filter working on the whole input signal (e.g. a TV signal) with exception of said reference signal. The main filter comprises a respective subset of adjustable small filters and a set of adjustable delays. The delays can be regarded as controlled by filter LMS1 and the small filters as controlled by filter LMS2.

Figure 2:
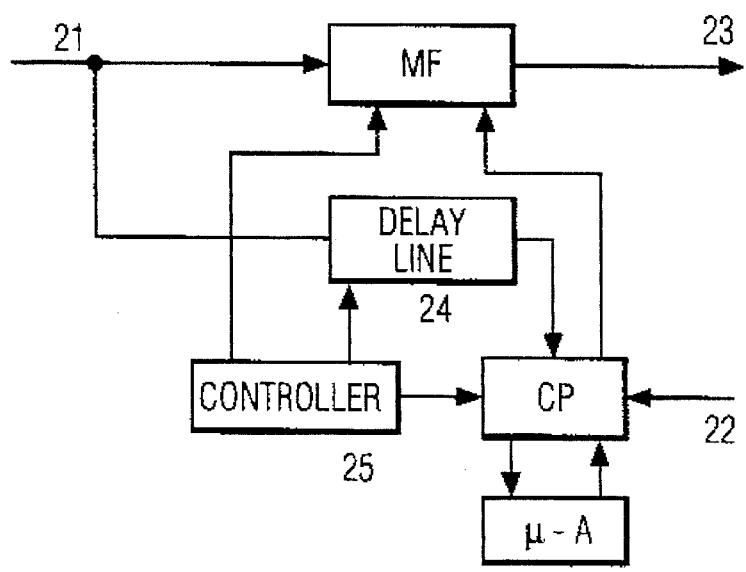
FIG. 2 shows a block diagram of the inventive apparatus.

In FIG. 2 a hardware block diagram for one possible embodiment of the inventive apparatus is depicted. A digital TV signal which may have been A/D converted is fed via input 21 to a 1296 tap transversal FIR filter MF, which corresponds to main filter MF in FIG. 1, and to a looped delay line 24 which can store 1296 samples of a received reference signal. At the output 23 of filter MF the corrected TV signal is available.

The content of delay line 24 is loaded (a sample at a time) to a central processor CP which gets also from input 22 respective samples of an ideal reference signal stored in a ROM or which has been decoded correctly from a received reference signal. CP represents the filters LMS1 and LMS2, the positioner 14 and the two subtractors 15 and 16 from FIG. 1. In CP the algorithms according to FIGS. 5–10 are carried out. The central processor also exchanges data with a μ-adaptation circuit μ-A and with a controller circuit 25.

The μ-adaptation circuit may contain a RAM and e.g. five counters in which E1 and E2, respectively, error values are accumulated and stored. Controller circuit 25 clocks the main filter and the delay line 24 and selects the special TV line(s) with a reference signal to be stored in delay line 24, while all other TV lines pass through the main filter.

The central processor loads the coefficients of the e.g. five small filters and the lengths of the adjustable delays to the main filter MF.

If the coefficient calculation needs more than one frame period, the valid coefficients can remain fixed for several frame periods.

Figure 3:
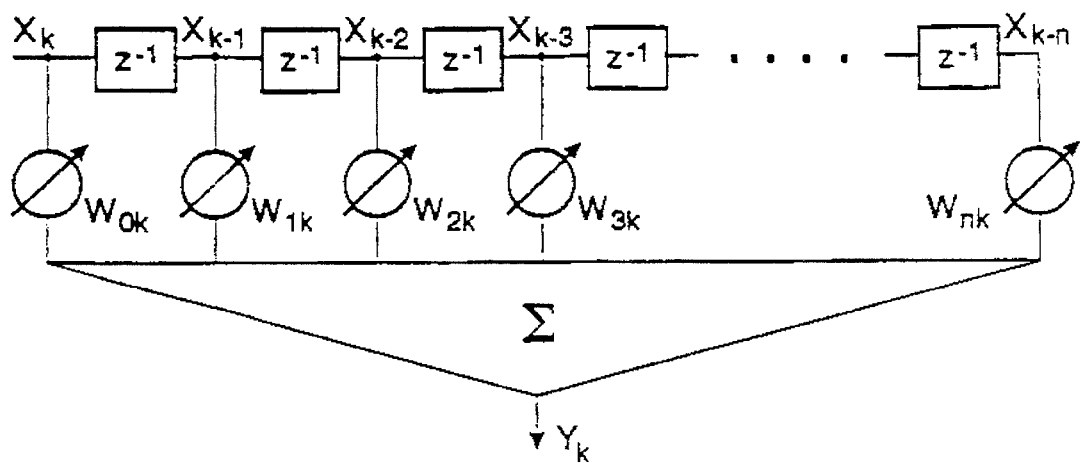
FIG. 3 depicts an adaptive linear combiner in the form of a single-input transversal filter.

FIG. 3 shows a linear combiner with an input signal $x_k$ and with one-clock delays $z^{-1}$ which deliver respective delayed input signals $x_{k-1}$ to $x_{k-n}$. Signals x to $x_{k-n}$ are multiplied with respective coefficients $w_{0k}$ to $w_{nk}$ and summed up to form the corrected output signal $y_k$.

Figure 4:
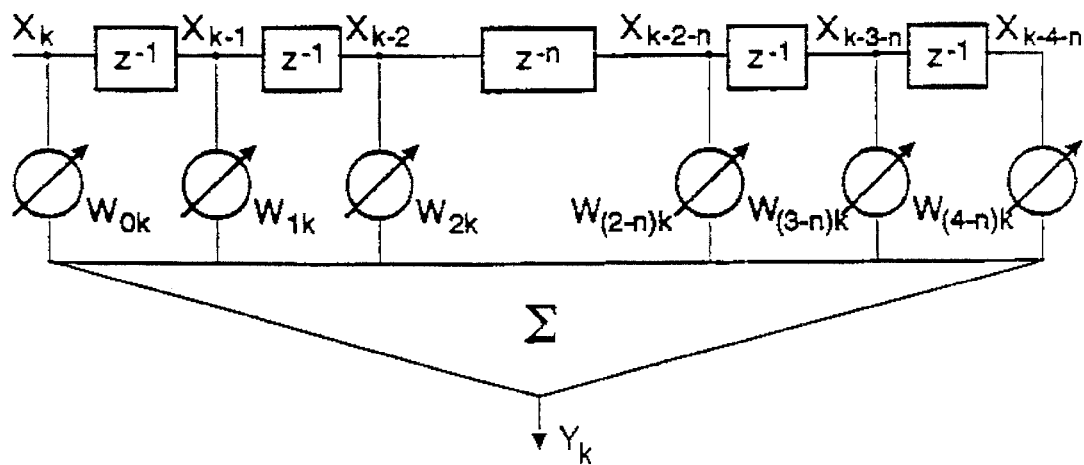
FIG. 4 shows a single-input transversal filter in the form of a tapped delay line.

FIG. 4 is similar to FIG. 3 and shows how the main filter MF can be constructed. The coefficients $w_{0k}$ to $w_{2k}$ correspond to a first small filter and the coefficients $w_{(2-n)k}$ to $w_{(4-n)k}$ correspond to a second small filter. Block $z^{-1}$ is a variable delay with n clocks delay time.

Figure 5:
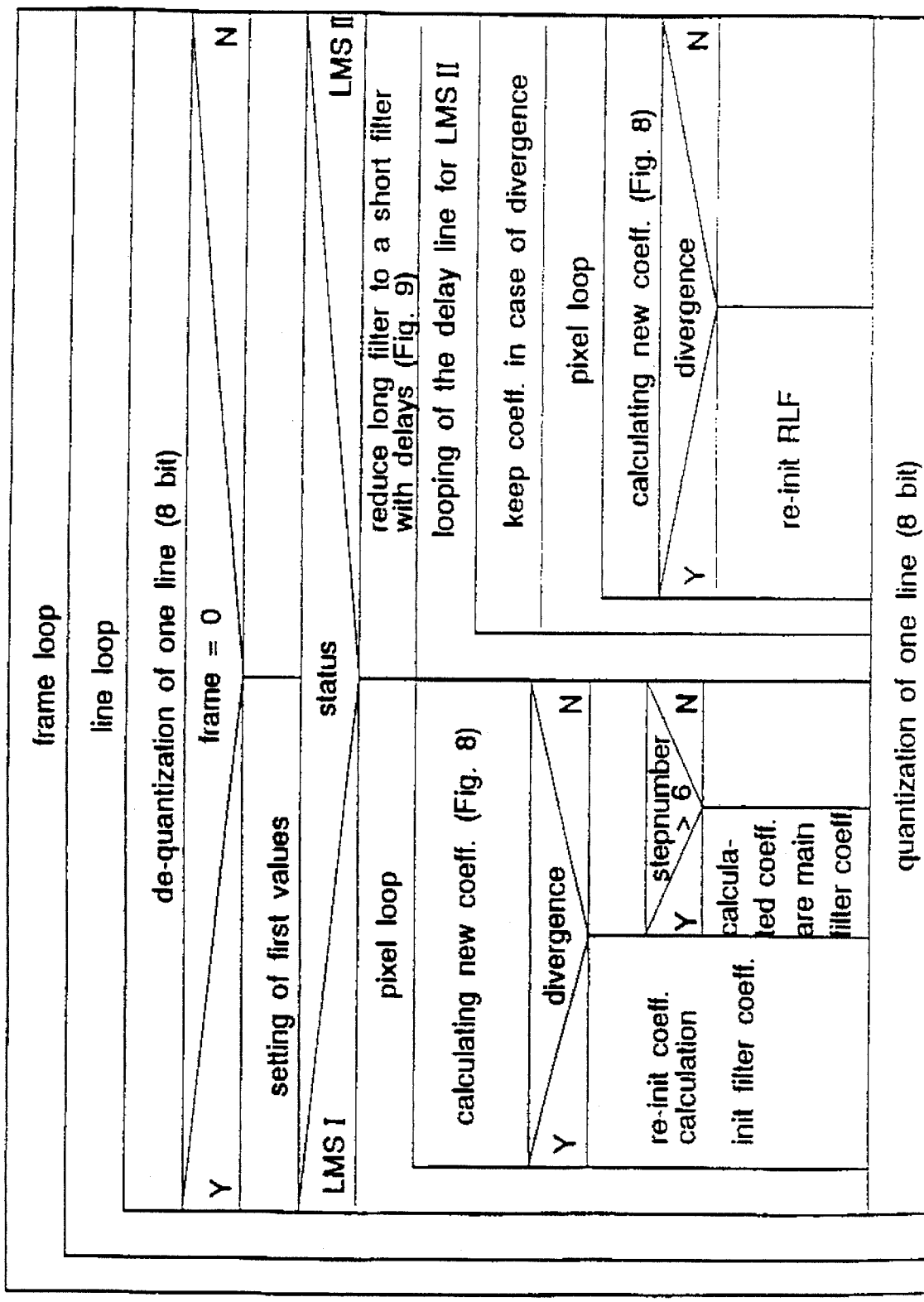
FIG. 5 depicts a flow chart diagram of the main algorithm.

In FIG. 5 'frame loop' and 'line loop' can be regarded as respective counters located in controller circuit 25. After switching on the TV set or after choosing another channel the Y-branch of test 'frame=0' is carried out. Coefficients stored in memory suited to usual or good reception of each received channel could also be used first.

In case of LMS1 calculation new coefficients are calculated according to the flow chart of FIG. 8. In case of divergence of the coefficient modification the coefficient calculation is re-initiated with another preselected filter response. This filter response may be matched to a different reception condition. If the coefficient modification converges and e.g. six modification loops have been made the resulting coefficients are used for the positioner 14 which works according to FIG. 9.

In case of LMS2 calculation the positioner 14 seeks for the location, i.e. the position information PI, of the small filters and of the delays within the 1296 taps. This is done according to FIG. 9. The last coefficients calculated in filter LMS2 are stored for the case of divergence of the LMS algorithm. New coefficients for the small filters are calculated with a second LMS algorithm in filter LMS2 according to FIG. 8 while the locations of the delay parts remain fixed. In case of divergence in the coefficient calculation the positioning is re-initiated, whereas in case of convergence the resulting coefficients are loaded from central processor CP to main filter MF.

The long filter LF of FIG. 7 corresponds to filter LMS1 and the short filter SF corresponds to a range for a small filter used in positioner 14. The left short filter CF is centred, i.e. the actual position AP corresponds to the central coefficient CeC.

The coefficients in the right half of CF are identical to the coefficients stored above in LF. The coefficients for the left half of CF are taken from the right end of LF (principle of looped delay line). The coefficients of the right half of the right filter SF are taken accordingly from the left end of LF.

Figure 6:
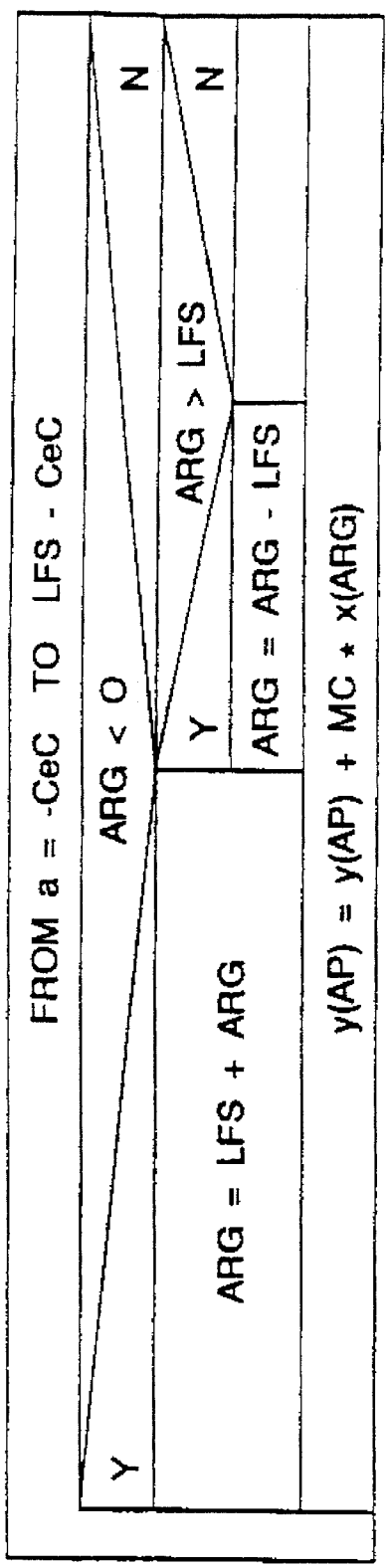
FIG. 6 shows a flow chart diagram of the output signal calculation.

FIG. 6 explains how the filter output is received, especially at the beginning and at the end of filter LMS1. If the argument ARG, i.e. the sum of the position within the size LFS of long filter LF and of the index of the actual coefficient, is less than zero, LFS is added to ARG. If ARG is greater than LFS, LFS is subtracted from ARG. The actual position AP has index 0 and corresponds to the central coefficient CeC of the small filter. The filter output y is calculated by summing up the respective x input values at position ARG which have been multiplied with the coefficient at position ARG.

The filter coefficients are calculated with the LMS algorithm according to FIG. 8, starting with a preselected filter response. Error s is calculated and an error statistic and/or the status (e.g. coefficients before, coefficients after, error, frame number, desired filter output) of a test pixel can be recorded in a RAM.

In case of LMS1 calculation all coefficients are tested if they are greater than a maximum coefficient value or less then a minimum value. If this is true a divergence flag DI is set to '1'. After coefficient calculation it is tested, if the sum S of all coefficients is less then half the central coefficient CeC. If this is true, DI is set to '1', too.

In case of LMS2 calculation advantageously the adaptation value μ is modified according to FIG. 10. The new coefficients for the small filters are calculated with the LMS2 algorithm and tested for divergence. This testing can be done like the testing in case LMS1. However, it may not be necessary to test the sum of the coefficients. In case of divergence the last coefficients stored are used for re-initiation.

According to FIG. 9 the positioner shifts a window corresponding to a small filter (e.g. 16 taps) along the positions of the delay line. For each actual position AP the squares of the LMS1 calculated coefficients corresponding to all small filter coefficient positions are summed. These 1296 sums are stored together with their position AP in a RAM which is called S/P store. Thereafter the sums in the S/P store are rearranged in decreasing order wherein the corresponding AP of each sum is kept. Normally the AP of the highest five sums indicates the positions of the main TV reference signal and the subsequent ghosts. But it has been found that the coefficient areas of the five small filters should not overlap. Therefore the coefficient position ranges of the small filters are compared. If e.g. the difference between the first AP and the second AP in the ordered list in the S/P store is smaller than the SFS, i.e. 16, than the both corresponding small filters overlap. In this case the second AP and its sum is ignored (e.g. deleted in the S/P store, followed by rearranging of the stored AP's) and the third AP is taken.

If the end of the S/P data within the S/P store is reached without having found five correct SF positions, the SF positions already set can be held and the remaining positions (next to set with greatest coeff.). The coefficients for the small filters may then be taken from the corresponding neighbouring coefficients of the coefficients C1 from the filter LMS1.

The positioner can be described as follows:

1. Begin with a large filter of (n+1) coefficients, C(0) to C(n).
2. Calculate the squares (or absolute values) of these coefficients, $A_0$ to $A_n$.
3. For each coefficient position i, form the running sum m(i) of the L coefficients surrounding and including $A_i$, where L is the small filter length:

$$m(i) = \sum_{j=-(L-1)/2}^{(L-1)/2} A_{i+j}.$$

The values of m(i) represent the coefficient energy which would be covered by a small filter centred on position i.

4. For each small filter desired:
   4.1 Find the maximum of m(i). Select a small filter at this position.
   4.2 Set the L values of m(i) surrounding and including this position to zero.

The result of this algorithm is to select a set of non-overlapping small filters which try to match the important parts of the large filter as closely as possible. However, under special conditions the positioner may not work correctly. Therefore, in a second embodiment of the positioner step 3 above can be modified to assign a higher weight to the central coefficient in the sliding window of L coefficients. The formula for m(i) then becomes:

$$m(i) = \sigma A_i + \sum_{\substack{j=-(L-1)/2 \\ (j \text{ not } 0)}}^{(L-1)/2} A_{i+j}.$$

The value of σ must be chosen as a compromise between making the improvement work and not assigning too much importance to individual coefficients. For example, with small filters of length L=5 a good value has been found to be σ=1.3.

Figure 12:
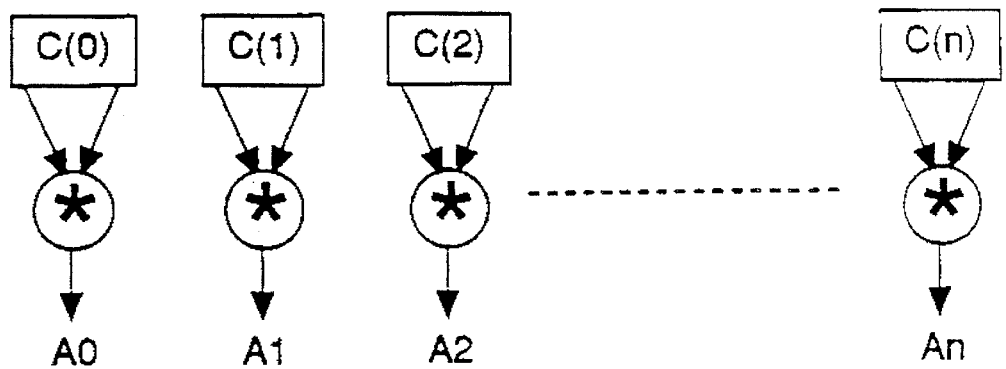
Figure 12:
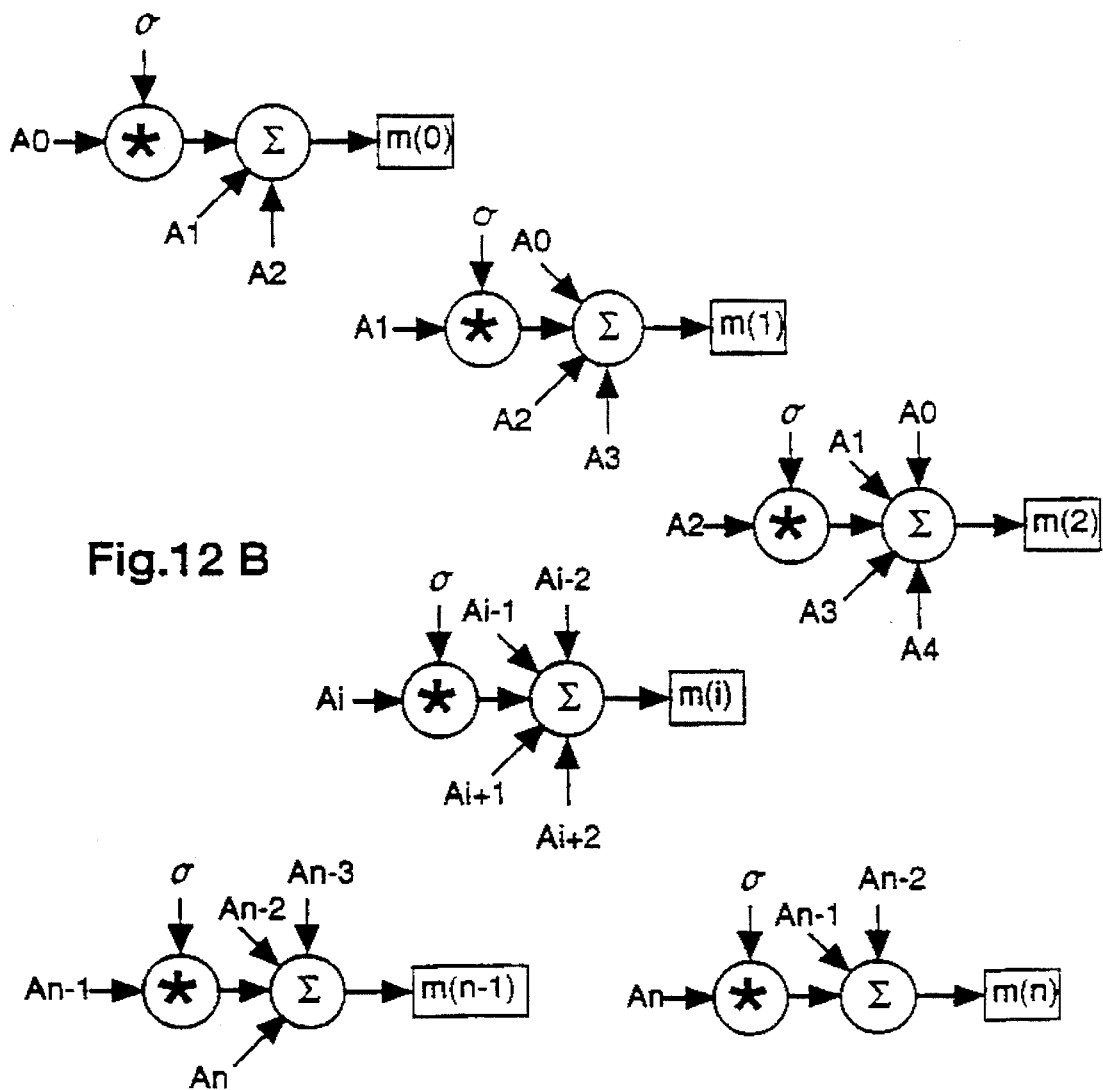

FIGS. 12 to 14 depict the operation of the second embodiment of the positioner. Index i runs from 0 to n and L=5. A number of k+1 small filters is used.

FIG. 12A corresponds to steps 1 and 2, e.g. $A_2=C(2)*C(2)$.

FIG. 12B corresponds to step 3, e.g. $m_2=\sigma A_2+(A_0+A_1+A_3+A_4)$.

FIG. 13 corresponds to step 4. From the running sum m(i) the maximum MAX=m($n_0$) is detected in FIG. 13A. Position $n_0$ is the centre of a first small filter. If this maximum is not zero, the running sums m(i), i=$n_{0-(L-1)/2}$ to $n_{0+(L-1)/2}$, are set (134) to zero. If the maximum m($n_0$) of the sums at position $n_0$ is zero, a fallback 131 is switched on (132, 133), in which a small filter position $n_1$ adjacent to the last significant filter position is selected by adding L to position $n_0$.

After zero setting of the L running sums the steps of FIG. 13A are repeated for receiving a further maximum.

FIG. 13B shows the respective steps for getting the last small filter centre position $n_k$.

In FIG. 14 the small filter centre positions $n_0, n_1, \ldots, n_k$ of (k+1) small filters are resorted in a sorter 141 into ascending order of the positions $n_{j0}, n_{j1}, \ldots, n_{jk}$ for small filters number '0', '1', . . . , 'k'.

From the centre position $n_{j0}$ for small filter '0' the value L/2 (integer) is subtracted in a first subtractor 142, resulting in delay time α for the first of the variable delays mentioned above.

From centre position $n_{j1}$ for small filter '1' the value L and the first centre position $n_{j0}$ are subtracted in a second subtractor 143, resulting in delay time β for the second of the variable delays mentioned above.

This procedure is continued respectively. From the last centre position $n_{jk}$ for small filter 'k' the value L and the centre position $n_{j(k-1)}$ are subtracted in a last subtractor 144, resulting in delay time λ for the last of the variable delays mentioned above.

E.g. five error classes for error E can be used according to FIG. 10. A counter C1 . . . C5 is assigned to each error class. If an error according to a specific error class occurs the respective counter is incremented and the counters of the other classes are set to zero. If the counter of the specific error class is greater than a preselected constant CON1 . . . CON5, the value for μ is adapted according to FIG. 10 and all counters are set to zero. The constants may have the following values: CON1=2000, CON2=1000, CON3=500, CON4=100, CON5=50. Due to the adaptation of μ the inventive method can work with improved speed and stability compared to known methods.

Programming was done in C language. The figures can be changed accordingly in case of other TV systems or of other reception conditions.

Advantageously an inventive equalizer with a long time constant and an inventive ghost canceller with a reduced time constant can be connected in series to have a fast response for moving ghosts and to have an exact equalization for static distortions or ghosts.

The invention can also be used for audio or data transmission having included a (digital) reference signal, e.g. DAB (digital audio broadcasting) and DTB (digital video broadcasting).

LIST OF ABBREVIATIONS

AC all counters
AP actual position
ARG argument
C counter
CaC calculated coefficient
CeC central coefficient
CF centred filter
CON constant
DI divergence
E error
E1 error 1
E2 error 2
Y yes
LF long filter
LFS long filter size
MC main coefficient
MF main filter
N no
P position
PI position information
RLF reduced long filter
ROC rest of counters
S sum
SF short filter
SFS short filter size
SP selected position
S/P sum/position

We claim:

1. A method for signal equalization/ghost cancellation with an equalizing filter wherein filter coefficients are adapted to minimize the error (E, E) between a received reference signal output by the equalizing filter and a non-distorted reference signal, said method comprising:

synthesizing a first equalizing filter function (LMS1) with N (an integer) taps and associated coefficients, wherein respective coefficients are adjusted to minimize the error between received reference signal output by the synthesized equalizing filter function and said non-distorted reference signal;

evaluating adjusted said coefficients to determine P (an integer) groups of M (an integer) taps and associated coefficients which contribute to said synthesized equalizing filter function according to a predetermined criterion and wherein P times M is less than N;

synthesizing a second equalizing filter function corresponding to said first equalizing filter function with coefficients other than said P groups of M coefficients set to zero, and adjusting said P groups to M coefficients to minimize said error;

applying adjusted said P groups of M coefficients to a programmable filter to configure said programmable filter to execute said second equalizing filter function on received signal.

2. The method set forth in claim 1 wherein respective coefficients are adjusted according to a least mean square (LMS) algorithm using an adaptation constant μ, which adaptation constant μ is adapted according to statistics of said error and which is updated during successive LMS calculations.

3. The method set forth in claim 1 wherein the step of evaluating comprises forming values corresponding to squares of respective coefficients and forming respective sums of predetermined numbers of said values corresponding to squares.

4. The method set forth in claim 2 wherein the step of evaluating comprises forming values corresponding to squares of respective e coefficients and forming respective sums of predetermined numbers of said values corresponding to squares.

5. The method set forth in claim 3 wherein one of said values corresponding to the squares in each sum is assigned a greater weight.

6. The method set forth in claim 4 wherein one of said values corresponding to the squares in each sum is assigned a greater weight.

7. The method set forth in claim 6 further including selecting the P largest sums and forming said respective groups from coefficients contributing to respective sums.

8. The method set forth in claim 3 further including selecting the P largest sums and forming said respective groups from coefficients contributing to respective sums.

9. A signal equalization/ghost cancellation filter apparatus wherein filter coefficients are adapted to minimize the error (E, E) between a received reference signal output by the equalizing filter and a non-distorted reference signal, said apparatus comprising:

a source of signal to be processed by said equalization/ghost cancellation filter apparatus, said signal including a received reference signal;

a source of a non-distorted reference signal;

circuitry for synthesizing a first equalizing filter function (LMS1) with N (an integer) taps and associated coefficients, including means for adjusting said coefficients to minimize any error between received reference signal output by the synthesized equalizing filter function and said non-distorted reference signal;

means for evaluating adjusted said coefficients to determine P (an integer) groups of M (an integer) taps and associated coefficients which contribute to said first equalizing filter function according to a predetermined criterion and wherein P times M is less than N;

means for synthesizing a second equalizing filter function corresponding to said first equalizing filter function with coefficients other than said P groups of M coefficients set to zero and for adjusting said P groups to M coefficients to minimize said error;

a programmable filter; and means for programming said programmable filter to execute said second equalizing filter function.

10. The apparatus set forth in claim 9 wherein said circuitry for synthesizing a first equalizing filter function (LMS1) comprises:

a delay means, coupled to said source of signal to be processed, and arranged to store said received reference signal;

a central processor which accesses said received reference signal from said delay means and non-distorted reference signal from said source of non-distorted reference signal, and responsive to said received and non-distorted reference signals, calculates respective said coefficients according to a least mean squares algorithm.

* * * * *

UNITED STATES PATENT AND TRADEMARK OFFICE
CERTIFICATE OF CORRECTION

PATENT NO. : 5,539,773
DATED : July 23, 1996
INVENTOR(S) : Michael Knee et al.

It is certified that error appears in the above-identified patent and that said Letters Patent is hereby corrected as shown below:

In Claim 1, column 7, line 61, after "minimize the error", delete (E, E)

In Claim 1, column 7, line 61, after "minimize the error", insert --($E$, E)--

In Claim 9, column 8, line 49, after "minimize the error", delete (E, E)

In Claim 9, column 8, line 49, after "minimize the error", insert --($E$, E)--

Note: $E$ is epsilon

Signed and Sealed this

Ninth Day of December, 1997

Attest:

BRUCE LEHMAN

Attesting Officer   Commissioner of Patents and Trademarks